(12) United States Patent
Kosonocky et al.

(10) Patent No.: US 8,193,799 B2
(45) Date of Patent: Jun. 5, 2012

(54) INTERPOSER INCLUDING VOLTAGE REGULATOR AND METHOD THEREFOR

(75) Inventors: Stephen V. Kosonocky, Fort Collins, CO (US); Samuel D. Naffziger, Fort Collins, CO (US); Visvesh S. Sathe, Fort Collins, CO (US)

(73) Assignee: GlobalFoundries Inc.

( * ) Notice: Subject to any disclaimer, the term of this patent is extended or adjusted under 35 U.S.C. 154(b) by 923 days.

(21) Appl. No.: 12/236,003

(22) Filed: Sep. 23, 2008

(65) Prior Publication Data

US 2010/0072961 A1    Mar. 25, 2010

(51) Int. Cl.
*B23K 11/24* (2006.01)
(52) U.S. Cl. ........................................... 323/285
(58) Field of Classification Search .................. 323/285
See application file for complete search history.

(56) References Cited

U.S. PATENT DOCUMENTS

| | | | |
|---|---|---|---|
| 7,479,769 B2 * | 1/2009 | Xu ................................ | 323/271 |
| 7,589,519 B2 * | 9/2009 | Park .......................... | 324/764.01 |
| 2002/0194516 A1 | 12/2002 | Muratov et al. | |
| 2003/0009702 A1 | 1/2003 | Park | |
| 2003/0218384 A1 | 11/2003 | Yoneda | |
| 2004/0240245 A1 | 12/2004 | Kenny, Jr. et al. | |
| 2006/0071650 A1 * | 4/2006 | Narendra et al. ............. | 323/285 |
| 2006/0099734 A1 | 5/2006 | Narendra et al. | |
| 2008/0059816 A1 | 3/2008 | Paniagua et al. | |
| 2008/0222436 A1 | 9/2008 | Matsui | |

FOREIGN PATENT DOCUMENTS

WO    9613100 A    5/1996

OTHER PUBLICATIONS

Knickerbocker et al., "3D Silicon Integration," 2008 IEEE Electronic Components and Technology Conference, 978-1-4244-2231-9/08, pp. 538-543.
Tsui et al., "Design and Fabrication of a Flip-Chip-on-Chip 3-D Packaging Structure with a Through-Silicon Via for Underfill Dispensing," IEEE Transactions on Advanced Packaging, vol. 28, No. 3, Aug. 2005, pp. 413-420.
PCT International Search Report mailed Dec. 16, 2009 for PCT/US2009/005308, 4 pages.

* cited by examiner

*Primary Examiner* — Robert L. Deberadinis

(57) ABSTRACT

A device that includes an electronic device referred to as an integrated circuit interposer is disclosed. The integrated circuit includes a voltage regulator module. The interposer is attached to an electronic device, such as another integrated circuit, and facilitates control and distribution of power to the electronic device. The integrated circuit interposer can also conduct signaling between the attached electronic device and another electronic device. The voltage regulator module at the integrated circuit interposer can be configured to provide a voltage reference signal to the attached electronic device. Generation of the voltage reference signal by the integrated circuit interposer can be enabled or disabled and the value of the voltage reference signal can be adjusted, depending on operating requirements of the electronic device.

19 Claims, 6 Drawing Sheets

INTERPOSER INCLUDING VOLTAGE REGULATOR AND METHOD THEREFOR

BACKGROUND

1. Field of the Disclosure

The present disclosure relates generally to devices, and more particularly to electronic devices having voltage regulators.

2. Description of the Related Art

Voltage regulators can be used to control or adjust an incoming source of electrical potential to meet specific requirements of an electronic device. A voltage regulator can increase or decrease the voltage provided by the source, and can be used to provide a substantially constant voltage to the device despite variations in the current dissipated by the device or variations in the value of the incoming source voltage. A portion of power that is supplied to an input of a voltage regulator is dissipated by the regulator and is thus not provided at the voltage regulator's output. The amount of power provided by a voltage regulator, expressed as a percentage fraction of the power received, can be referred to as the voltage conversion efficiency of the voltage regulator.

BRIEF DESCRIPTION OF THE DRAWINGS

The present disclosure may be better understood, and its numerous features and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION

A device that includes an electronic device referred to as an integrated circuit interposer is disclosed. The integrated circuit includes a voltage regulator module. The interposer is attached to an electronic device, such as another integrated circuit, and facilitates control and distribution of power to the electronic device. The integrated circuit interposer can also conduct signaling between the attached electronic device and another electronic device. The voltage regulator module at the integrated circuit interposer can be configured to provide a voltage reference signal to the attached electronic device. Generation of the voltage reference signal by the integrated circuit interposer can be enabled or disabled and the value of the voltage reference signal can be adjusted, depending on operating requirements of the electronic device. Furthermore, the voltage regulator module can be configured to provide an increased voltage conversion efficiency in response to a particular operating requirement of the electronic device. The integrated circuit interposer can also be referred to as an "interposer".

Providing power to an electronic device, such as an integrated circuit device, can be difficult. For example, a modern microprocessor integrated circuit device can dissipate a significant amount of power. Furthermore, the microprocessor can operate at a low voltage, and thus require considerable electric current. A large electric current typically cannot be conducted to the integrated circuit via a single electrical connection or terminal. For example, a microprocessor integrated circuit device can utilize hundreds of individual contacts to receive and adequately provide power to particular portions of the device.

Power consumed by an electronic device can be provided by a power supply to a regulating device at an elevated voltage to minimize resistive power loss. This elevated voltage can be subsequently reduced by the regulating device, such as a voltage regulator, to provide power to a specific electronic device. The device and methods disclosed herein provide a voltage regulator module that can provide power to an electronic device. The voltage regulator module is disposed at an interposer attached to the electronic device. Providing the voltage regulator module immediately proximate to the attached electronic device can further minimize resistive power loss. In addition, the voltage regulator module can provide power at different efficiencies based upon control information received at the voltage regulator module control input to save power during operation of the electronic device.

Figure 1:
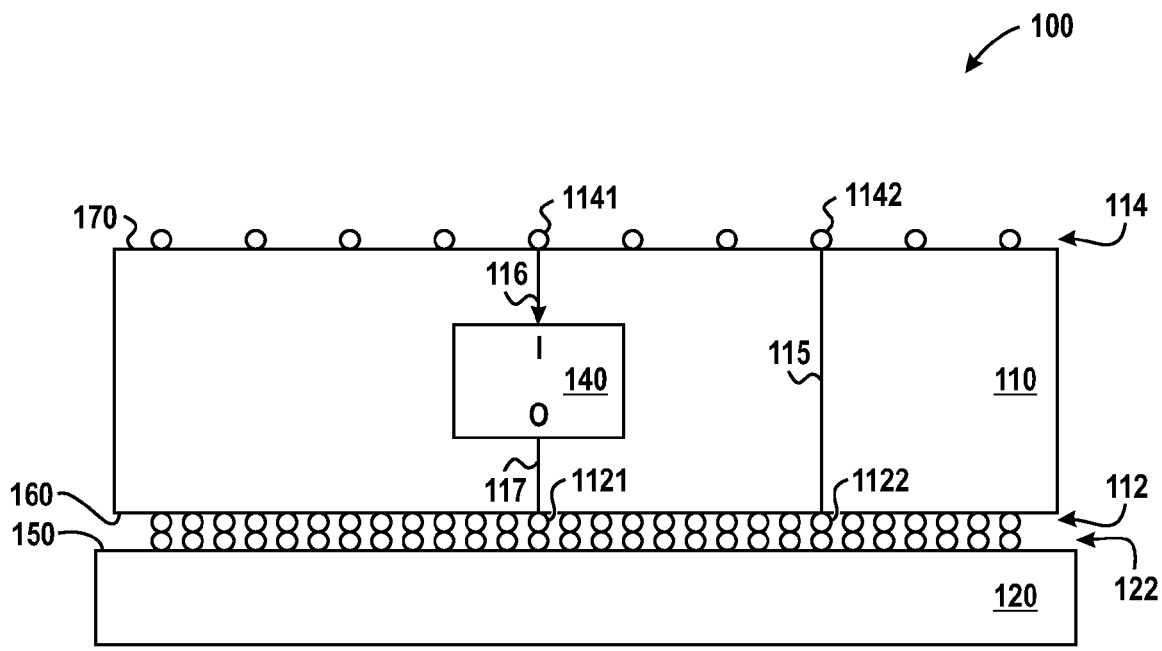
FIG. 1 includes an illustration of a cross sectional view of an electronic device including an integrated circuit interposer attached to an electronic device in accordance with a specific embodiment of the present disclosure.

FIG. 1 illustrates a cross sectional view of an electronic device 100 including an interposer 110 and an associated electronic device 120. Interposer 110 can provide power regulation for electronic device 120, as well as providing a signal interface between electronic device 120 and another electronic device. Interposer 110 includes a major surface 170, a major surface 160, a voltage regulator module 140, and an interconnect 115. Major surface 170 includes contacts 114, and major surface 160 includes contacts 112. Contacts 114 further include contacts 1141 and 1142, and contacts 112 further include contacts 1121 and 1122. Voltage regulator module 140 has an input to receive a voltage signal from contact 1141 via interconnect 116 and an output to provide a voltage reference signal to contact 1121 via interconnect 117. Contacts 1122 and 1142 are electrically connected by interconnect 115.

Electronic device 120 includes major surface 150. Major surface 150 faces major surface 160 of interposer 110, and includes contacts 122. Electronic device 120 can be an integrated circuit, such as a die, and contacts 122 can be a portion of major surface 150. Contacts 122 of electronic device 120 and contacts 112 of interposer 110 are arranged such that each respective contact of contacts 122 can be electrically connected to a corresponding contact of contacts 112. The total number of contacts 112 can be the same as the total number of contacts 122, or the numbers of each can differ, in which case not every contact of contacts 112 or contacts 122 will be connected to a corresponding contact. Contacts 114, 112, and 122 can include ball-shaped structures, planar landings, pins, other suitable types of contacts, or a combination thereof. Voltage regulator module 140 can include a voltage regulator as well as other passive or active electronic devices, such as transistors, diodes, resistors, capacitors, inductors, the like, or any combination thereof.

Signals can be conducted between electronic device 120 and another electronic device via interposer 110. For example, electronic device 120 of electronic device 100 can include a microprocessor, and interposer 110 can conduct signals between the microprocessor and external electronic devices of a computer printed circuit board. A signal can be received from an external electronic device at contact 1142 of interposer 110, conducted to contact 1122 via interconnect 115, and further conducted to a corresponding contact of contacts 122 of electronic device 120. A signal can be provided by electronic device 120, conducted via contact 1122, interconnect 115, and contact 1142, and thus provided to an external electronic device. A voltage signal can be received from an external power source, such as a power supply, at contact 1141 and conducted to an input of voltage regulator module 140 via interconnect 116. A voltage reference signal can be provided at the output of voltage regulator module 140 and conducted to contact 1121 of interposer 110 via interconnect 117, and further conducted to a corresponding contact of contacts 122 of electronic device 120. Interconnect 115 can include a through-die-via.

The number, size, spacing, shape, and arrangement of contacts 114 can be the same or can be different as the number, size, spacing, shape and arrangement of contacts 112 of interposer 110. For example, incorporating a voltage regulator module and power distribution interconnections at interposer 120 can facilitate including a smaller number of contacts 114 than of contacts 112. As a result, contacts 114 can be larger and can be spaced further apart than the contacts of contacts 112. For example, voltage regulator module 140 can receive an elevated voltage signal, reducing the level of current conducted to the input of the voltage regulator module and thus require fewer contacts to conduct the voltage signal.

Figure 2:
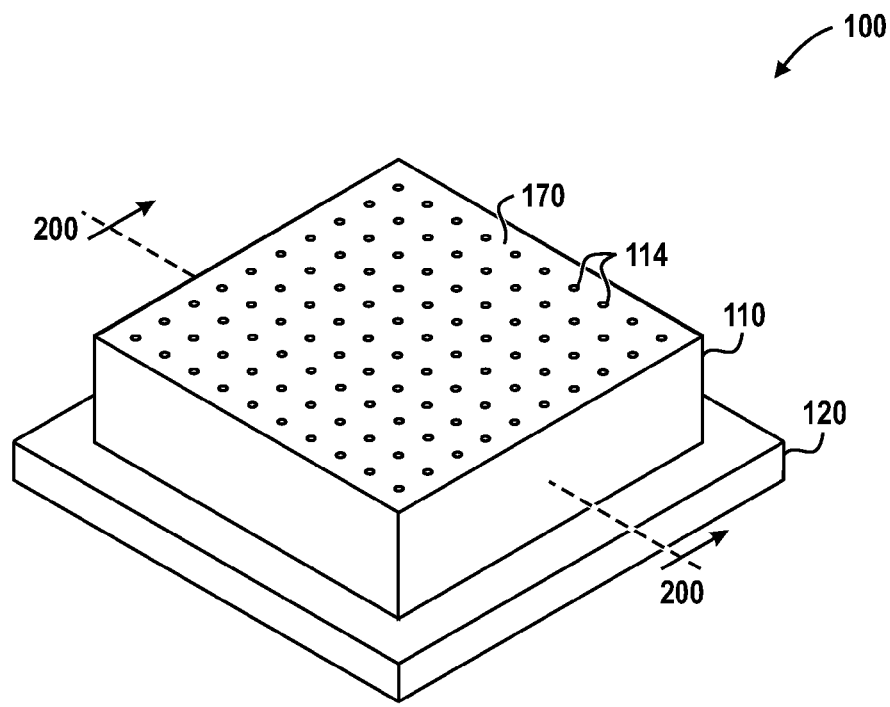
FIG. 2 includes an illustration of a perspective view of the assembly of FIG. 1.

FIG. 2 illustrates a perspective view of electronic device 100 at FIG. 1. Cross section 200 corresponds to the cross sectional view illustrated at FIG. 1.

Figure 3:
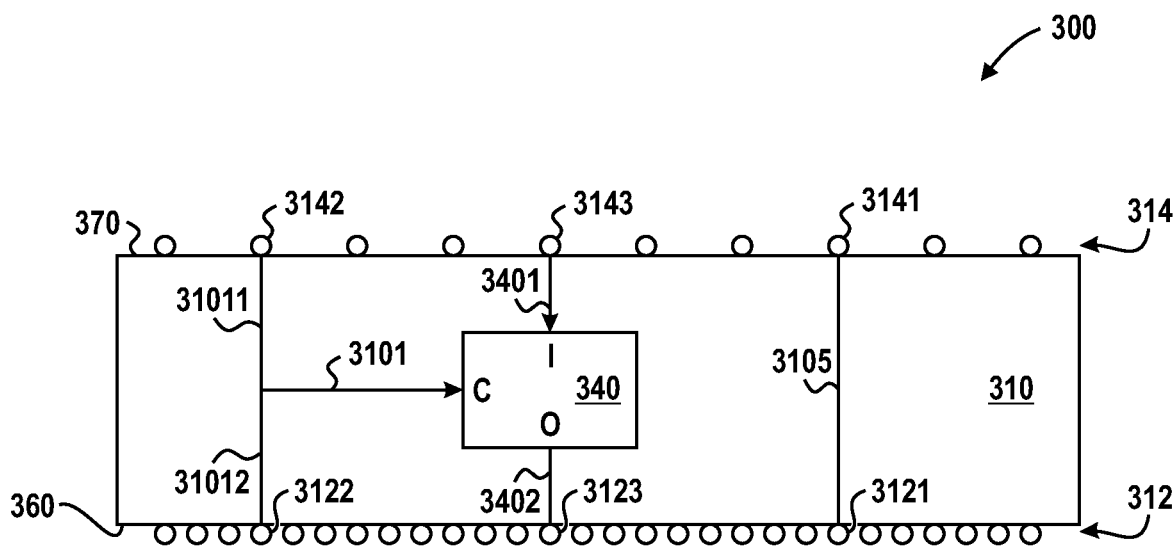
FIG. 3 includes an illustration of a cross sectional view of an integrated circuit interposer and included voltage regulator module in accordance with a specific embodiment of the present disclosure.

FIG. 3 illustrates a cross sectional view 300 of an interposer 310 that can be a specific embodiment of interposer 110 at FIG. 1. Interposer 310 includes a major surface 370, a major surface 360, and a voltage regulator module 340. Major surface 370 includes contacts 314 and major surface 360 includes contacts 312. Contacts 314 include individual contacts 3141-3143, and contacts 312 include individual contacts 3121-3123. Voltage regulator module 340 has an input to receive a voltage signal from contact 3143 via interconnect 3401, a control input to receive a control signal via interconnect 3101, and an output to provide a voltage reference signal to contact 3123 via interconnect 3402. Voltage regulator module 340 can correspond to voltage regulator module 140 at FIG. 1, and interconnects 3401 and 3402 can correspond to interconnects 116 and 117 at FIG. 1, respectively. Interconnect 3101 can include one or both of interconnects 31011 and 31012 to receive a control signal from one or both of contacts 3142 and 3122. Interposer 310 includes interconnect 3105, which can conduct signals between contact 3141 and contact 3121. Interconnect 3105 can correspond to interconnect 115 at FIG. 1. Relative to FIG. 3, contacts 314 provide a signal interface to an overlying electronic device and contacts 312 provide a signal interface to an underlying electronic device, such as electronic device 120 at FIG. 1.

Voltage regulator module 340 can receive a voltage signal and can provide a voltage reference signal. A control signal providing control information can be received at the control input of voltage regulator module 340 to enable or disable generation of the voltage reference signal, select a particular value of the voltage reference signal, select an operating efficiency, or any combination thereof. The control information can be provided by the overlying electronic device, the underlying electronic device, the interposer, or any combination thereof. The control signal can be a digital signal or an analog control signal. In a particular embodiment illustrated, interconnect 3101 can represent an individual interconnect to conduct a single control signal. In another embodiment, interconnect 3101 can represent multiple individual interconnects and conduct multiple control signals. For example, three interconnects can be used to conduct three-bit digitally encoded control information capable of selecting eight operating conditions.

Interconnect 3105 can be referred to as a "feed-through" electrical connection because it can conduct a signal between the overlying and the underlying electronic devices. For example a signal provided by the overlying electronic device can be received at contact 3141, conducted via interconnect 3105 to contact 3121, and received at a corresponding contact of the underlying electronic device. The feed-through can conduct signals originating at the overlying electronic device, the underlying electronic device, or can support bidirectional communication wherein either device can provide the signal. Furthermore, a feed-through can conduct a signal between a respective contact of contacts of contacts 314 and a corresponding contact of contacts 312. Feed-through 3105 is illustrated as a straight conductor, it will be appreciated that interconnect 3105 can include horizontal and vertical routing relative to major surfaces 360 and 370.

Figure 4:
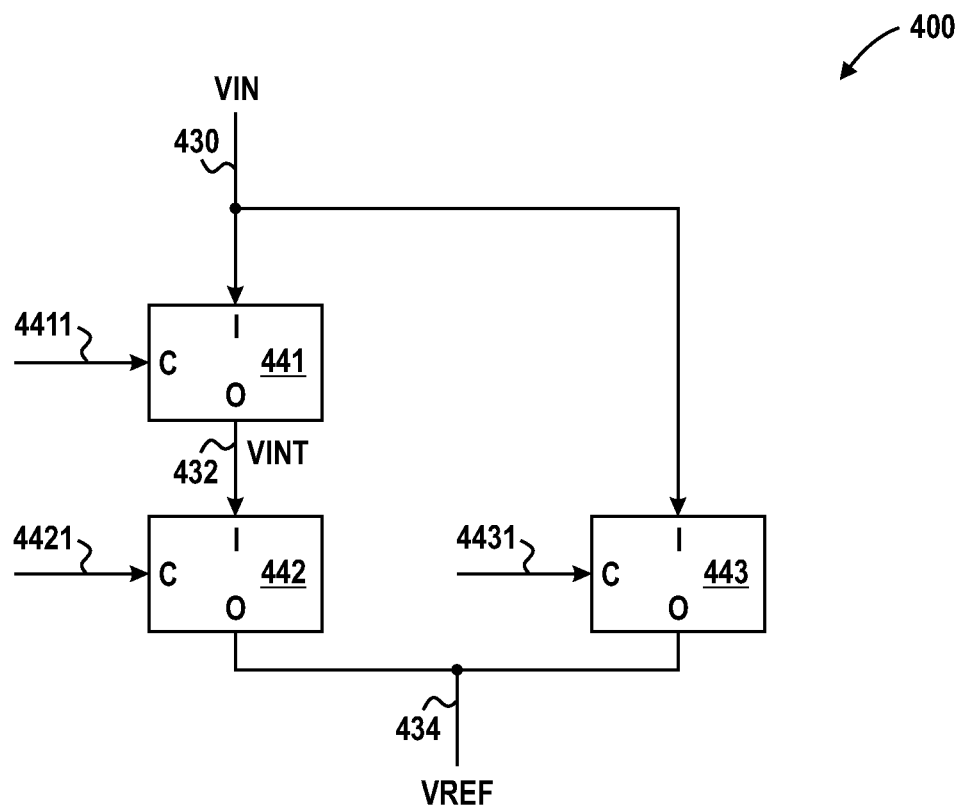
FIG. 4 includes an illustration of a schematic view of a voltage regulator module in accordance with a specific embodiment of the present disclosure.

FIG. 4 illustrates a schematic view of a voltage regulator module 400, which can be a specific embodiment of voltage regulator module 340 at FIG. 3. Voltage regulator module 400 includes a voltage regulator 441, a voltage regulator 442, a voltage regulator 443, and interconnects 430, 432, 434, 4411, 4421, and 4431. Voltage regulator 441 has an input connected to interconnect 430 to receive a voltage signal labeled "VIN," a control input connected to interconnect 4411 to receive a control signal, and an output connected to interconnect 432 to provide a voltage reference signal labeled "VINT". Voltage regulator 442 has an input connected to interconnect 432 to receive voltage reference signal VINT, a control input connected to interconnect 4421 to receive a control signal, and an output connected to interconnect 434 that can provide a voltage reference signal labeled "VREF". Voltage regulator 443 has an input connected to interconnect 430 to receive voltage signal VIN, a control input connected to interconnect 4431 to receive a control signal, and an output connected to interconnect 434 that can provide voltage reference signal VREF. Interconnects 4421 and 4431 can correspond to interconnect 3101 at FIG. 3. Interconnect 430 can correspond to interconnect 116 at FIG. 1 and interconnect 3401 at FIG. 3. Interconnect 434 can correspond to interconnect 117 at FIG. 1 and interconnect 3402 at FIG. 3.

Respective control information received at a corresponding control input of a voltage regulator can configure a voltage reference signal provided at an output of that voltage regulator. For example, control information received at a control input can enable and disable generation of a respective output voltage reference signal, and it can select the value of the respective output voltage reference signal. Voltage reference signal VREF can be provided by either voltage regulator 442 or by voltage regulator 443 based upon control information received at the control input of each of regulators 442 and 443. Determining which, or both, of regulators 442 and 443 are selected to provide voltage reference signal VREF can be based upon an attribute of an electronic device. In a particular embodiment, the attribute used to determine the selection, such as a selection criteria, can include the value of voltage reference signal VREF that is required by the underlying electronic device. The selection criteria also can be based upon which regulator, or combination of regulators, can provide voltage reference signal VREF most efficiently, with respect to power dissipated by the regulators.

The voltage conversion efficiency of a voltage regulator can be a measure of how much power is provided at the output of the regulator compared to how much power is consumed at the input of the regulator, the difference being power that is lost, such as dissipated by the regulator. For example, if a voltage regulator dissipates 20% of the total incoming power, it can be said to be 80% efficient. The voltage conversion efficiency of a regulator can depend on the specific class of the regulator and the difference between the voltages at the input and the output of the regulator. A class of regulator known as a "switched-capacitor" regulator can be most efficient when the voltage difference between the regulator's input and output is high. Another class of regulator known as a "linear" regulator can be most efficient when the voltage difference between the regulator's input and the output is low.

Referring again to FIG. 4, voltage regulator 441 can be a switched-capacitor regulator, and voltage regulators 442 and 443 can be linear regulators. For a particular value of input voltage signal VIN, and a particular value of output voltage reference signal VREF, the overall voltage conversion efficiency of voltage regulator module 400 can depend on whether VREF is provided by voltage regulator 442 (in combination with voltage regulator 441), or by voltage regulator 443. Furthermore, at a particular time, the required value of voltage reference signal VREF can change. For example, an underlying electronic device that is receiving voltage reference signal VREF, such as electronic device 120 at FIG. 1, may include a CPU that can operate at any of multiple conditions. Voltage regulator module 400 can be configured to provide a high voltage reference signal VREF to support operating the CPU at a high clock frequency, and can be configured to provide a low voltage reference signal VREF to support operating the CPU at a lower clock frequency. Voltage regulator module 400 can be configured to provide an even lower voltage reference signal VREF when the CPU is placed into a "sleep" mode. As the operating mode and corresponding operating voltage of the CPU changes, voltage regulator module 400 can be configured to provide voltage reference signal VREF in the most efficient manner.

Figure 5:
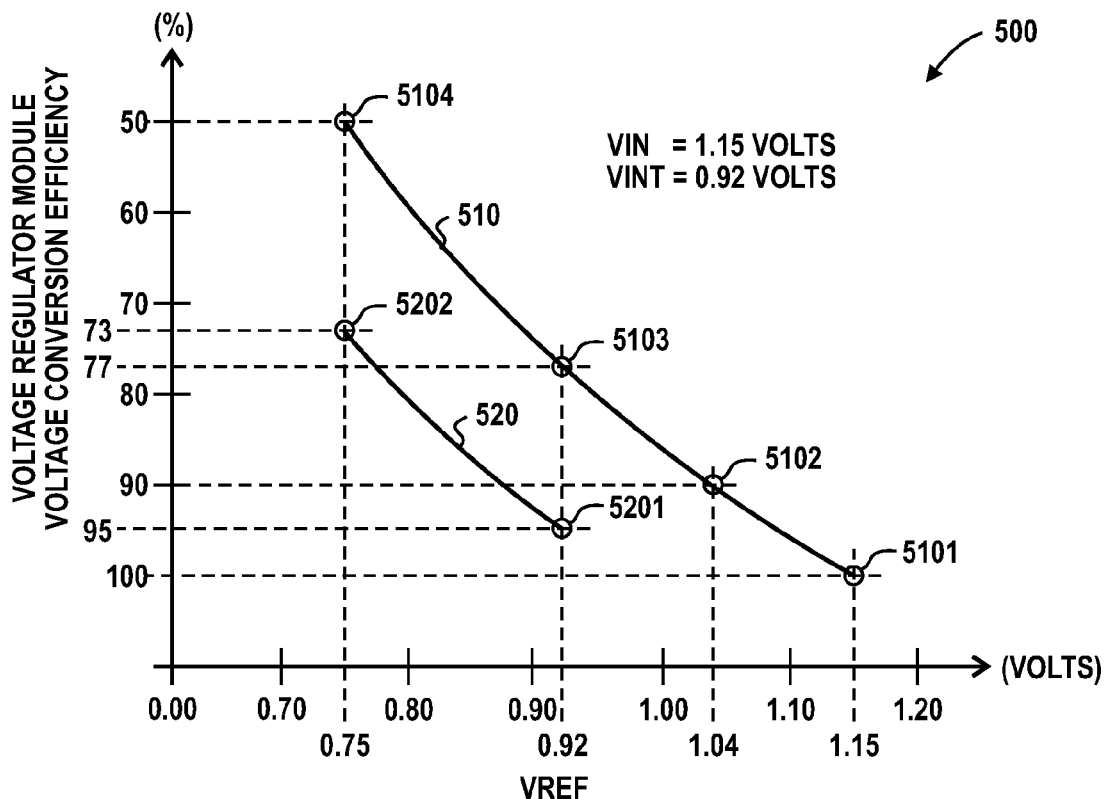
FIG. 5 includes a graph illustrating the voltage conversion efficiency of a voltage regulator module as a function of a value of an output voltage reference signal in accordance with a specific embodiment of the present disclosure.

FIG. 5 includes a graph 500 that illustrates a voltage conversion efficiency of a voltage regulator module, such as voltage regulator module 400 at FIG. 4, as a function of a value of a generated voltage reference signal VREF. The horizontal axis of graph 500 represents the value of voltage reference signal VREF provided by voltage regulator module 400, in volts. The vertical axis of graph 500 represents the voltage conversion efficiency of voltage regulator module 400, expressed as a percentage. Graph 500 includes data curve 510 and data curve 520. Data curve 510 includes specific operating points 5101, 5102, 5103, and 5104, and data curve 520 includes specific operating points 5201, 5202, and 5203.

Data curve 510 can correspond to the operation of a linear regulator, receiving voltage signal VIN and providing voltage reference signal VREF. For this example, data curve 510 can correspond to the efficiency of the linear voltage regulator over a range of output voltages. For the present example, regulator 443 can be a linear voltage regulator as represented by curve 510. Data curve 520 can correspond to the efficiency of a switched-capacitor voltage regulator in combination with a linear voltage regulator over a range of output voltages. For the present example, the efficiency of voltage regulator 441 in combination with voltage regulator 442 can be represented by curve 520. Voltage regulator 441 can be a switched-capacitor voltage regulator, and voltage regulator 442 can be a linear voltage regulator. Switched-capacitor regulator 441 can receive voltage signal VIN and can provide voltage reference signal VINT to linear regulator 442, which in turn can provide voltage reference signal VREF. Linear voltage regulator 443 can receive voltage signal VIN and can provide voltage reference signal VREF. Graph 500 represents the operating condition wherein voltage signal VIN is 1.15 volts, and voltage reference signal VINT is 0.92 volts.

Operating point 5101 corresponds to an operating condition where linear voltage regulator 443 is providing an output voltage, VREF, of 1.15 volts. Because the voltage difference between the input and output of voltage regulator 443 is substantially zero, the voltage conversion efficiency of voltage regulator 443 is substantially 100%. Operating point 5102 corresponds to an operating condition where voltage regulator 443 is providing an output voltage of 1.04 volts. Because voltage regulator 443 is providing a small voltage reduction, the voltage conversion efficiency is 90%. Operating point 5104 corresponds to an operating condition where linear voltage regulator 443 is providing an output voltage of 0.75 volts. Because voltage regulator 443 is providing a relatively large voltage reduction, the voltage conversion efficiency is 50%.

Operating point 5201 corresponds to an operating condition where the combination of switched-capacitor voltage regulator 441 and linear voltage regulator 442 is providing an output voltage, VREF, of 0.92 volts. Because linear voltage regulator 442 is providing a voltage substantially the same as the value received, substantially zero power is lost by voltage regulator 442. Switched-capacitor voltage regulator 441 is reducing the input voltage signal (VIN) from 1.15 volts to 0.92 volts (VINT=VREF), and because it can do this efficiently, the combined voltage conversion efficiency of the two regulators is 95%. Note that operating point 5103, using only linear voltage regulator 443 provides the same (0.92) value of voltage reference signal VREF, but does so at a significantly lower voltage conversion efficiency of 77%. Operating point 5202 corresponds to an operating condition where switched-capacitor voltage regulator 441 is reducing the value of voltage signal VIN to 0.92 volts (VINT), and linear voltage regulator 442 is further reducing VINT to provide a voltage reference signal of 0.75 volts. The combined voltage conversion efficiency of the two regulators is 73%.

The preceding example illustrates that between the voltages of 0.74 volts and 0.92 volts, the combination of voltage regulators 441 and 442 can provide a better voltage conversion efficiency than provided by only voltage regulator 443, powered directly by voltage signal VIN. Therefore, it will be appreciated that a voltage regulator module can be configured to increase operating voltage conversion efficiency in response to selection criteria, such as an attribute of an electronic device. If the attached electronic device, such as electronic device 120 at FIG. 1, requires an operating voltage reference signal VREF of above 0.92 volts, linear voltage regulator 443 can provide this value most efficiently. If the attached electronic device requires an operating voltage reference signal VREF of below 0.92 volts, the combination of switched-capacitor voltage regulator 441 and linear voltage regulator 442 can provide this value most efficiently.

An electronic device can include subsystems, each subsystem requiring a different operating voltage. A voltage regulator module included at an interposer, such as interposer 110 at FIG. 1, can be configured to provide voltage reference signals, at specific voltage levels, to specific subsystems. Furthermore, the operating voltage required by a subsystem can change. The voltage regulator module can be configured to support changing operating requirements and to operate with preferred voltage conversion efficiency in response to the particular operating requirement. For example, an electronic device, such as electronic device 120 at FIG. 1, can include multiple processor cores, memory controllers, graphics processing units, and other subsystems. Each subsystem or a portion of the electronic device can require a different operating voltage and the required operating voltage can change during operation of the electronic device, such as when a processor core enters a "sleep" mode. Options can be provided in an operating system or basic input/output system (BIOS) that allows a user to select specific system and subsystem behavior and the voltage regulator module can be configured accordingly by referring to the lookup table. Due to manufacturing variation, a processor core can require a higher or lower operating voltage to meet the product specification. Information identifying these requirements can be included at each core, and the BIOS can configure the interposer voltage regulator module to provide the respective operating voltage to each processor and thus improve the operating efficiency of the subsystem as well as the voltage conversion efficiency of the voltage regulator module. In a specific embodiment, an electronic device attached to an interposer can include a look-up table or circuitry that can indicate how to configure the voltage regulator module at the interposer to achieve better operating efficiency corresponding to the particular operating requirements of the electronic device. In another embodiment, the interposer itself can include a look-up table or circuitry that can indicate how to configure the included voltage regulator module to achieve better operating efficiency.

Figure 6:
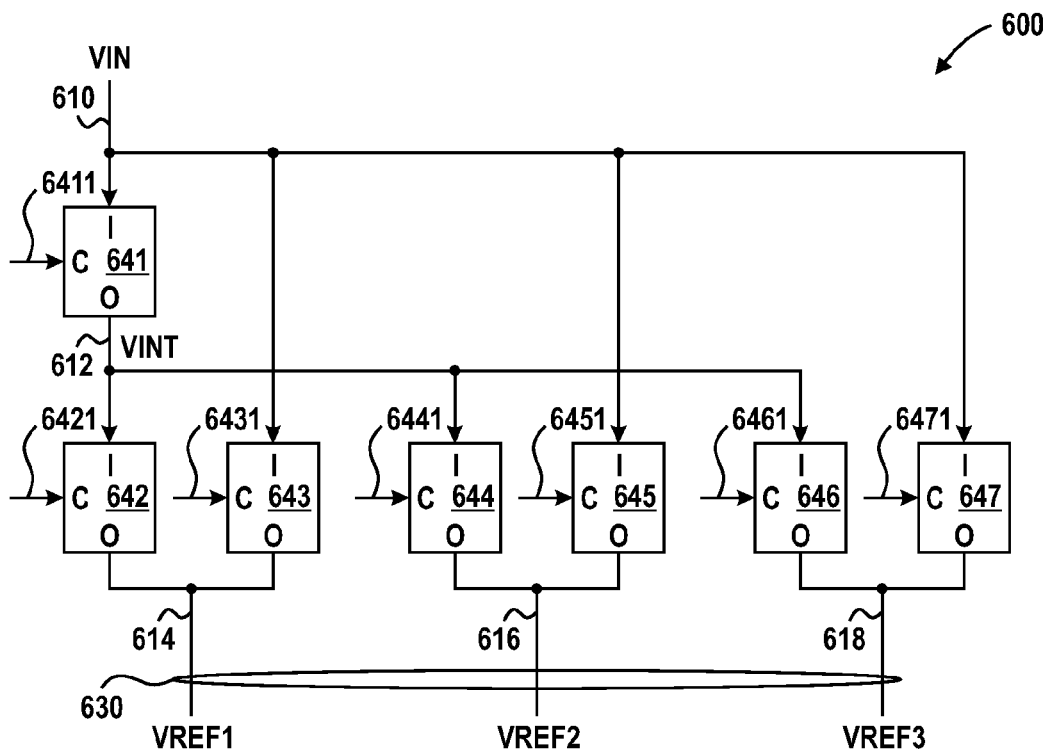
FIG. 6 includes an illustration of a schematic view of a voltage regulator module including seven voltage regulators in accordance with a specific embodiment of the present disclosure.

FIG. 6 illustrates a schematic view of a voltage regulator module 600 that can be a specific embodiment of voltage regulator module 340 at FIG. 3. Voltage regulator module 600 includes seven individual voltage regulators 641-647 and related interconnects, and can provide three individually adjustable voltage reference signals. Interconnect 630 includes individual interconnects 614, 616, and 618 and can correspond to interconnect 3402 at FIG. 3. Voltage regulator 641 has an input connected to interconnect 610 to receive a voltage signal labeled "VIN", a control input connected to interconnect 6411, and an output connected to interconnect 612 that can provide a voltage reference signal labeled "VINT". Voltage regulator 642 has an input connected to interconnect 612 to receive voltage signal VINT, a control input connected to interconnect 6421, and an output connected to interconnect 614 that can provide a voltage reference signal labeled "VREF1". Voltage regulator 643 has an input connected to interconnect 610 to receive voltage signal VIN, a control input connected to interconnect 6431, and an output connected to interconnect 614. Voltage regulator 644 has an input connected to interconnect 612 to receive voltage signal VINT, a control input connected to interconnect 6441, and an output connected to interconnect 616 that can provide a voltage reference signal labeled "VREF2". Voltage regulator 645 has an input connected to interconnect 610 to receive voltage signal VIN, a control input connected to interconnect 6451, and an output connected to interconnect 616. Voltage regulator 646 has an input connected to interconnect 612 to receive voltage signal VINT, a control input connected to interconnect 6461, and an output connected to interconnect 618 that can provide a voltage reference signal labeled "VREF3". Voltage regulator 647 has an input connected to interconnect 610 to receive voltage signal VIN, a control input connected to interconnect 6471, and an output connected to interconnect 618.

Voltage regulator module 600 can provide three voltage reference signals, VREF1, VREF2, and VREF3. The respective value of each voltage reference signal can be configured to satisfy a constant or a changing voltage requirement of a corresponding portion of an electronic device that is receiving power from voltage regulator module 600, such as electronic device 120 at FIG. 1. For example, a set of voltage regulators including voltage regulators 641, 642, 644, and 646 can be configured to provide voltage reference signals VREF1, VREF2, and VREF3. At another time, the set of voltage regulators can include voltage regulators 643, 645, and 647. At still another time, the set of voltage regulators can include voltage regulator 641, 642, 645, and 647. The voltage regulator module can be configured by control information received from an attached electronic device, or by control information provided by circuitry included at voltage regulator module 600 (not shown). In a particular embodiment, voltage regulator 641 can be a switched-capacitor voltage regulator and voltage regulators 642-647 can be linear voltage regulators.

Figure 7:
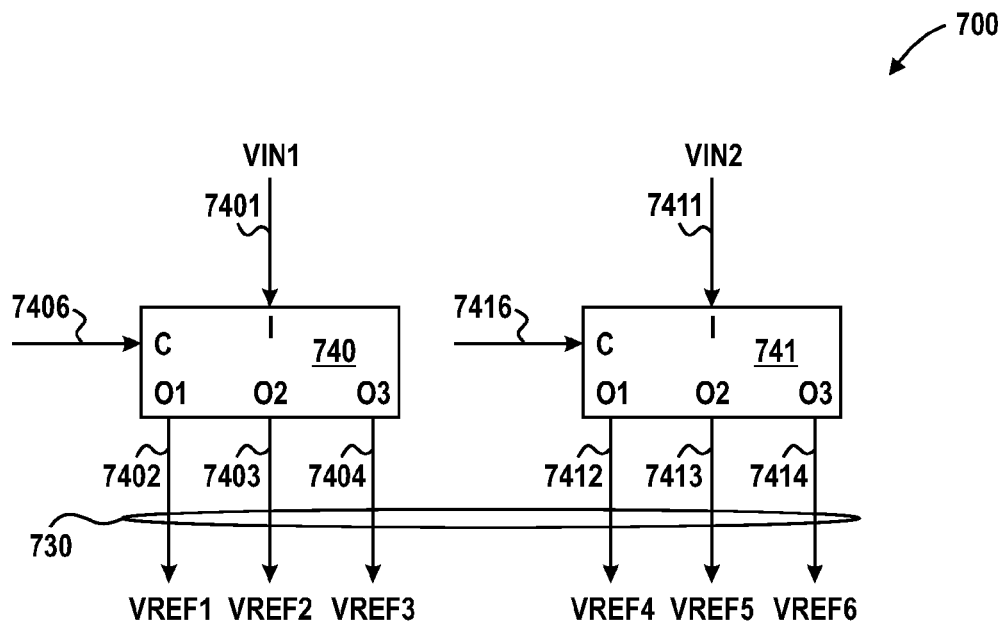
FIG. 7 includes an illustration of a schematic view of a voltage regulator module including two portions in accordance with a specific embodiment of the present disclosure.

FIG. 7 illustrates a schematic view of a voltage regulator module 700 including portions 740 and 741, each of which can provide three voltage reference signals. Portion 740 has an input to receive a voltage signal labeled "VIN1" via interconnect 7401, a control input to receive a control signal via interconnect 7406, a first output that can provide a first voltage reference signal labeled "VREF1" via interconnect 7402, a second output that can provide a second voltage reference signal labeled "VREF2" via interconnect 7403, and a third output that can provide a third voltage reference signal labeled "VREF3" via interconnect 7404. Portion 741 has an input to receive a voltage signal labeled "VIN2" via interconnect 7411, a control input to receive a control signal via interconnect 7416, a first output that can provide a fourth voltage reference signal labeled "VREF4" via interconnect 7412, a second output that can provide a fifth voltage reference signal labeled "VREF5" via interconnect 7413, and a third output that can provide a sixth voltage reference signal labeled "VREF6" via interconnect 7414. Interconnect 730 includes individual interconnects 7402, 7403, 7404, 7412, 7413, and 7414.

Each portion, 740 and 741, can correspond to voltage regulator module 600 at FIG. 6 or regulator module 340 at FIG. 3, and interconnect 730 can correspond to interconnect 3402 at FIG. 3 or interconnect 630 at FIG. 6. Voltage regulator module 700 can supply individual voltage reference signals to six corresponding portions of an electronic device. While two portions, each supplying three voltage reference signals are illustrated, after reading this specification, skilled artisans will understand that a different number of portions, each providing a particular number of voltage reference signals, can be included in a voltage regulator module, to satisfy the requirements of a specific electronic device.

Figure 8:
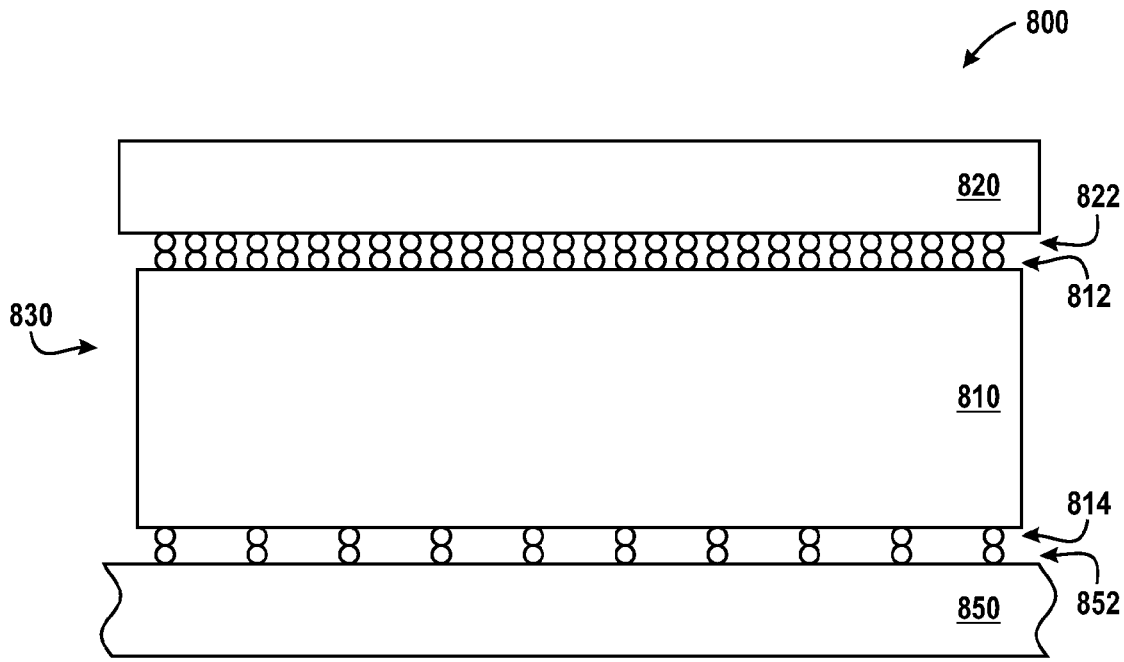
FIG. 8 includes an illustration of a cross sectional view of an interposer used to interface two electronic devices in accordance with a specific embodiment of the present disclosure.

FIG. 8 illustrates a cross sectional view 800 of an electronic device 830 attached to another electronic device 850. Electronic device 830 can be a specific embodiment of the elements illustrated at FIG. 1, and includes an interposer 810 and an associated electronic device 820. Interposer 810 includes contacts 812 and contacts 814. Electronic device 820 includes contacts 822 and electronic device 850 includes contacts 852. Interposer 810 can correspond to interposer 310 at FIG. 3. Interposer 810 can conduct signals between associated electronic device 820 and electronic device 850 and can provide a voltage reference signal to electronic device 820. A respective contact of contacts 812 of interposer 810 can connect to a corresponding contact of contacts 822 of electronic device 820, and a respective contact of contacts 814 of interposer 810 can connect to a corresponding contact of contacts 852 of electronic device 850. A voltage regulator module at interposer 810 can receive a voltage signal from electronic device 850 via a contact of contacts 852, a corresponding contact of contacts 814. The voltage regulator module can provide a voltage reference signal to electronic device 820 via a respective contact of contacts 812 and a corresponding contact of contacts 822. In a particular embodiment, electronic device 850 can be a printed circuit board such as a computer main board, and electronic device 820 can be a CPU.

Figure 9:
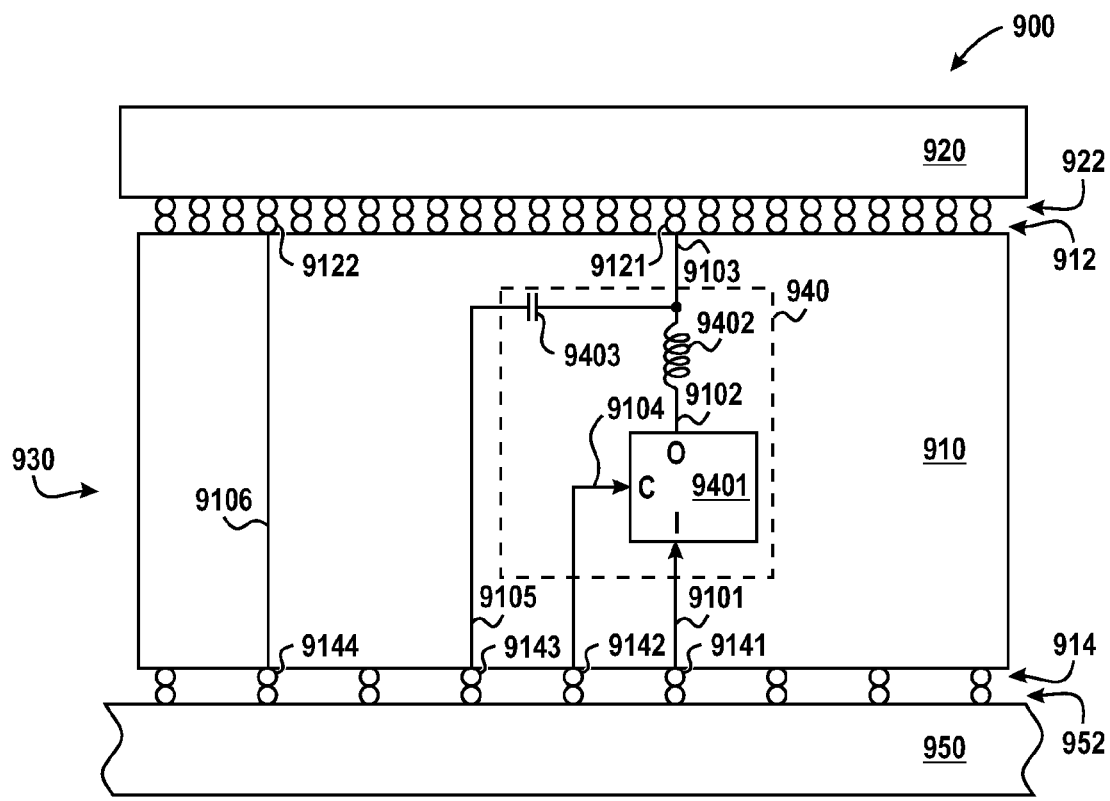
FIG. 9 includes an illustration of a cross sectional view of a packaged integrated circuit interposer used to interface two electronic devices in accordance with a specific embodiment of the present disclosure.

FIG. 9 illustrates a cross sectional view 900 of an electronic device 930 attached to another electronic device 950. Electronic device 930 can be a specific embodiment of the elements illustrated at FIG. 1, and includes an interposer 910 and an associated electronic device 920. Interposer 910 is a packaged electronic device and includes contacts 912, contacts 914, and voltage regulator module 940. Contacts 912 include individual contact 9121 and 9122. Contacts 914 include individual contacts 9141, 9142, 9143, and 9144. Voltage regulator module 940 includes a voltage regulator module subcomponent 9401, inductor 9402, and capacitor 9403. Voltage regulator module subcomponent 9401 can represent voltage regulator module 340 at FIG. 3. Voltage regulator module subcomponent 9401 has an input to receive a voltage signal from contact 9141 via interconnect 9101, a control input to receive a control signal from contact 9142 via interconnect 9104, and an output to provide a voltage reference signal. Inductor 9402 has in input to receive the voltage reference signal from voltage regulator module subcomponent 9401, and an output connected to contact 9121 via interconnect 9103. Capacitor 9403 has an input connected to contact 9121 and an output connected to contact 9143 via interconnect 9105. Interconnect 9106 can conduct signals between contact 9122 and contact 9144. Electronic device 920 includes contacts 922 and electronic device 950 includes contacts 952.

Interposer 910 can conduct signals between associated electronic device 920 and electronic device 950 and can provide a voltage reference signal to electronic device 920. A respective contact of contacts 912 of interposer 910 can connect a corresponding contact of contacts 922 of electronic device 920, and a respective contact of contacts 914 of interposer 910 can connect to corresponding contact of contacts 952 of electronic device 950. Interposer 950 is a packaged electronic device that can include active components, such as voltage regulator module subcomponent 9401, and passive electronic components such as inductor 9402 and capacitor 9403. Interposer 950 also can include interconnects to conduct signals between these components, and between a respective components and a corresponding contact of contacts 912, 914, or both. As previously described, interconnects, such as interconnect 9106, can conduct signals between a respective contact of contacts 912 and a corresponding contact of contacts 914 to provide a feed-through. The interconnects can be routed in a horizontal and vertical orientation relative to major surfaces of interposer 910, and multiple levels of horizontal interconnects can be provided.

Figure 10:
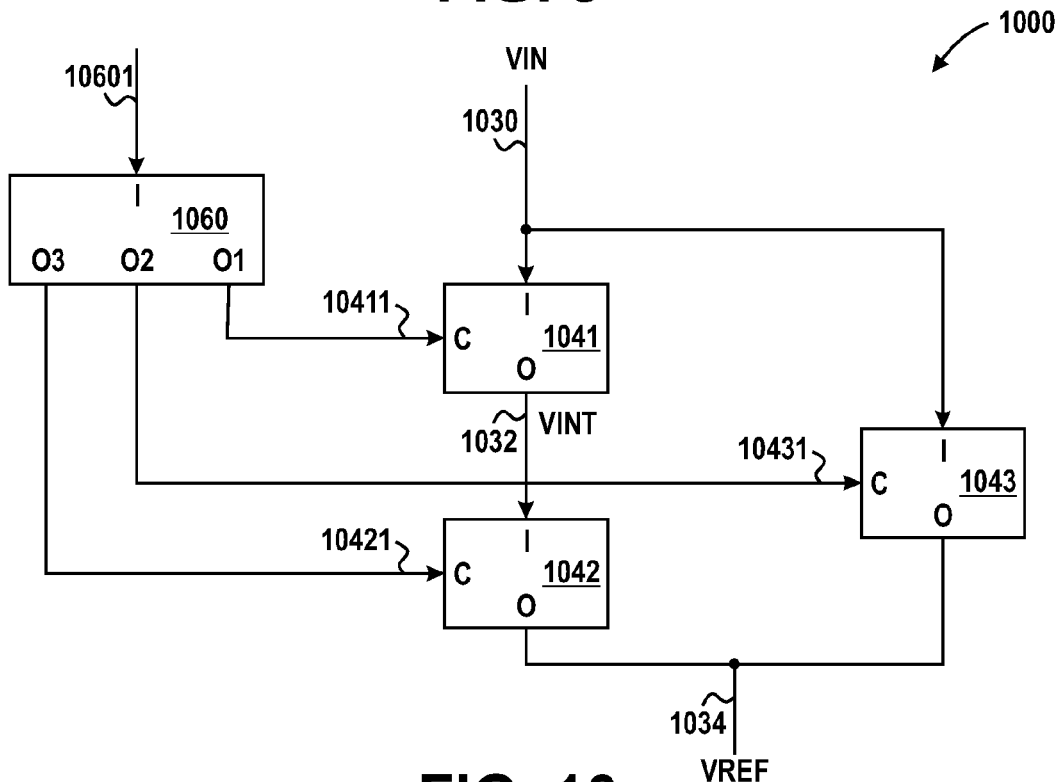
FIG. 10 includes an illustration of a schematic view of a voltage regulator module and an associated efficiency management module in accordance with a specific embodiment of the present disclosure.

FIG. 10 illustrates a schematic view of a device 1000 and includes voltage regulators 1041, 1042, and 1043, efficiency management module 1060, and interconnects 1030, 1032, 1034, 10411, 10421, and 10431. Voltage regulator 1041 has an input connected to interconnect 1030 to receive a voltage signal labeled "VIN," a control input, and an output connected to interconnect 1032 to provide a voltage reference signal labeled "VINT". Voltage regulator 1042 has an input connected to interconnect 1032 to receive voltage reference signal VINT, a control input, and an output connected to interconnect 1034 that can provide a voltage reference signal labeled "VREF". Voltage regulator 1043 has an input connected to interconnect 1030 to receive voltage signal VIN, a control input, and an output connected to interconnect 1034 that can provide voltage reference signal VREF. Efficiency management module has in input to receive a control signal via interconnect 10601, a first output to provide a control signal to voltage regulator 1041 via interconnect 10411, and second output to provide a control signal to voltage regulator 1042 via interconnect 10421, and a third output to provide a control signal to voltage regulator 1043 via interconnect 10431. Interconnect 1030 can correspond to interconnect 116 at FIG. 1 and interconnect 3401 at FIG. 3. Interconnect 1034 can correspond to interconnect 117 at FIG. 1 and interconnect 3402 at FIG. 3.

Efficiency management module 1060 can be located at an interposer, such as at interposer 810 at FIG. 8, or at an electronic device such as electronic devices 820 or 850 at FIG. 8. Efficiency management module 1060 can receive control information regarding device attributes and provide control signals to voltage regulators 1041, 1042, and 1043 accordingly. For example, efficiency management module 1060 can receive information identifying the desired operating voltage of an associated electronic device, such as electronic device 820 at FIG. 8, and configure voltage regulators 1041, 1042, and 1043 to provide the desired operating voltage in an efficient manner.

Figure 11:
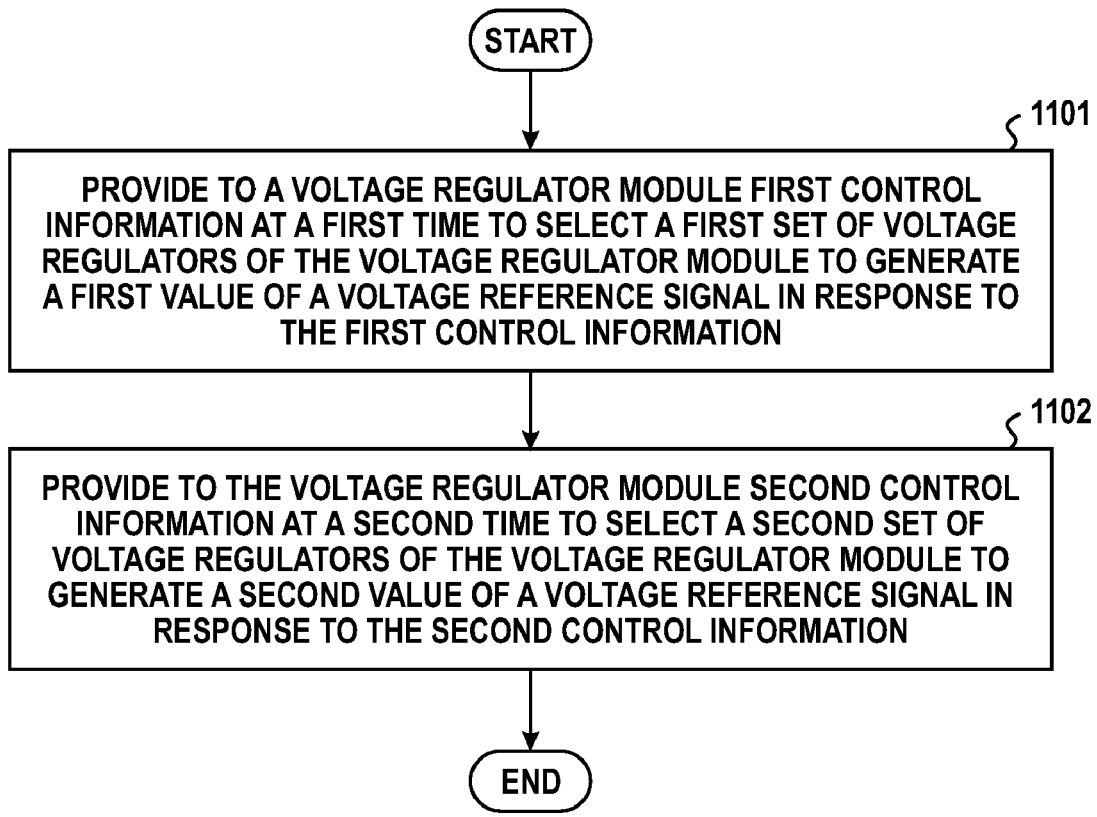
FIG. 11 includes a flow diagram illustrating a method in accordance with a specific embodiment of the present disclosure.

FIG. 11 includes a flow diagram that illustrates a procedure to configure a voltage regulator module, such as voltage regulator module 340 at FIG. 3, to provide a voltage reference signal of a particular value, and to do so such that the voltage regulator module operates at a preferred efficiency. At block 1101, a voltage regulator module is provided first control information at a first time to select a first set of voltage regulators of the voltage regulator module to generate a first value of a voltage reference signal in response to the first control information. At block 1102, the voltage regulator module is provided second control information at a second time to select a second set of voltage regulators of the voltage regulator module to generate a second value of the voltage reference signal in response to the second control information.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, an interposer, such as interposer 110 at FIG. 1, can include a packaged or an unpackaged silicon die. An electronic device attached to an interposer, such as electronic device 120 at FIG. 1, can also include a silicon die or a packaged device.

Contacts of the interposer can be soldered to corresponding contacts of an electronic device, or an electrical connection between corresponding contacts can be established by compressively clamping the interposer and electronic device together, the use of a socket assembly, or by another suitable technique. For example, referring to FIG. 8, contacts 812 of interposer can be soldered to corresponding contacts 822 of electronic device 820 forming an assembly corresponding to electronic device 830. Electronic device 830 can be attached to electronic device 850 via a socket assembly provided at electronic device 850.

The physical dimensions of an interposer can be the same or can be different from the dimensions of an attached electronic device. Contacts that are a portion of a major surface of an interposer or of an electronic device can be arranged uniformly or non-uniformly. For example, the contacts can be organized as a fully populated rectangular array or another organization. These size, shape, arrangement and number of contacts, and other physical attributes illustrated are presented for the purposes of example and should not be considered as limiting the scope of the present disclosure.

While specific classes of voltage regulators have been illustrated, other classes can be substituted and can be configured to increase voltage conversion efficiency of the regulators as well as the operating efficiency of the an electronic device. Specific voltage and voltage conversion efficiency values, the number of curves included at graph 500 at FIG. 5, and reference to a specific voltage regulator module such as voltage regulator module 400 at FIG. 4, are presented for the purpose of example and should not be considered as limiting the scope of the present disclosure.

Illustrated interconnects and contacts included at an interposer, such as interconnects 115, 116 and 117, and contacts 1141 and 1121 at FIG. 1, can represent one or more individual interconnects or contacts. For example, interconnect 117 can include multiple individual interconnects and provide a voltage reference signal to multiple contacts of contacts 112. Providing power using multiple individual interconnects and multiple contacts can reduce power loss due to contact and interconnect resistance.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising:
a first electronic device comprising a first major surface and a second major surface, the first major surface comprising a first contact, and a second contact; and
a second electronic device comprising:
a first major surface facing the first major surface of the first electronic device comprising a first contact electrically connected to the first contact of the first electronic device, and a second contact electrically connected to the second contact of the first electronic device,
a second major surface comprising a third contact and a fourth contact, and
a first voltage regulator module comprising an input coupled to receive a first voltage signal via the third contact, and an output coupled to the first contact to provide a first voltage reference signal in response to a first selection criteria being met.

2. The device of claim 1 wherein:
the value of the first voltage reference signal is configurable based upon a signal received at the second contact of the second electronic device.

3. The device of claim 1 wherein:
the value of the first voltage reference signal is configurable based upon a signal received at the fourth contact of the second electronic device.

4. The device of claim 1 wherein:
the second electronic device further comprises a second voltage regulator module comprising an input coupled to receive a second voltage signal from the fourth contact, and an output coupled to the first contact of the second electronic device to provide a second voltage reference signal.

5. The device of claim 4 further comprising:
the first major surface of the second electronic device comprising a fifth contact and a sixth contact; and
the value of the first voltage reference signal is configurable based upon a signal received at the fifth contact of the second electronic device and the value of the second voltage reference signal is configurable based upon a signal received at the sixth contact.

6. The device of claim 1 wherein:
the second electronic device further comprises a second voltage regulator module comprising an input coupled to receive a voltage from the fourth contact, and an output coupled to the second contact to provide a second regulated voltage.

7. The device of claim 1 wherein:
the first voltage regulator module comprising two voltage regulators.

8. The device of claim 1 wherein:
the second electronic device further comprises the fourth contact being coupled to the second contact of the second electronic device to communicate a signal between the fourth contact and the second contact of the second electronic device.

9. The device of claim 1 wherein:
the first voltage regulator module further comprises active and passive electronic components.

10. A method comprising:
receiving a first voltage signal at an input of a first voltage regulator module of an integrated circuit;
generating a first voltage reference signal at the first voltage regulator module in response to a first selection criteria being met;

receiving the first voltage reference signal at a first contact of a first major surface of the integrated circuit; and receiving the first voltage reference signal at a second contact of a first major surface of an electronic device via the first contact, wherein the first major surface of the integrated circuit is immediately adjacent to the first major surface of the electronic device.

11. The method of claim 10 further comprising:

receiving the first voltage signal at a third contact of a second major surface of the integrated circuit, the second major surface opposite the first major surface.

12. The method of claim 10 wherein:

the response that the first selection criteria is met is provided by the electronic device.

13. The method of claim 10 wherein:

the response that the first selection criteria is met is provided by the integrated circuit.

14. The method of claim 10 wherein:

the first selection criteria is based upon an attribute of the electronic device.

15. The method of claim 14 wherein:

the attribute of the electronic device is a desired voltage level.

16. The method of claim 10 wherein:

the first voltage regulator module comprises two voltage regulators.

17. The method of claim 10 further comprising:

receiving a first data signal at a third contact of a second major surface of the integrated circuit, the second major surface opposite the first major surface;

receiving the first data signal at a fourth contact of the first major surface of the integrated circuit via a conductor connecting the third contact of a second major surface of the integrated circuit to fourth contact of the first major surface of the integrated circuit; and receiving the first signal at a fifth contact of the first major surface of the electronic device via the fourth contact.

18. The method of claim 10 further comprising:

receiving a second voltage signal at an input of a second voltage regulator module of the integrated circuit;

generating a second voltage reference signal at the second voltage regulator module;

receiving the second voltage reference signal at a third contact of the first major surface of the integrated circuit; and receiving the second voltage reference signal at a fourth contact of the first major surface of the electronic device via the third contact.

19. A method comprising:

providing to a voltage regulator module first control information at a first time to select a first set of voltage regulators of the voltage regulator module to generate a first value of a voltage reference signal in response to the first control information, and providing to the voltage regulator module second control information at a second time to select a second set of voltage regulators of the voltage regulator module to generate a second value of the voltage reference signal in response to the second control information.

* * * * *